(12) United States Patent
Dewey et al.

(10) Patent No.: US 9,287,380 B2
(45) Date of Patent: *Mar. 15, 2016

(54) GATE ELECTRODE HAVING A CAPPING LAYER

(71) Applicant: Intel Corporation, Santa Clara, CA (US)

(72) Inventors: Gilbert Dewey, Hillsboro, OR (US); Mark L. Doczy, Portland, OR (US); Suman Datta, Beaverton, OR (US); Justin K. Brask, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/136,589

(22) Filed: Dec. 20, 2013

(65) Prior Publication Data

US 2014/0103458 A1  Apr. 17, 2014

Related U.S. Application Data

(60) Continuation of application No. 13/770,767, filed on Feb. 19, 2013, now Pat. No. 8,803,255, which is a continuation of application No. 13/044,356, filed on Mar. 9, 2011, now Pat. No. 8,390,082, which is a continuation of application No. 12/354,702, filed on Jan. 15, 2009, now Pat. No. 7,915,694, which is a division of application No. 11/322,745, filed on Dec. 30, 2005, now Pat. No. 7,524,727.

(51) Int. Cl.
*H01L 29/78* (2006.01)
*H01L 29/51* (2006.01)
*H01L 21/28* (2006.01)
*H01L 21/8238* (2006.01)
*H01L 29/49* (2006.01)
*H01L 29/66* (2006.01)

(52) U.S. Cl.
CPC ........ *H01L 29/513* (2013.01); *H01L 21/28088* (2013.01); *H01L 21/28194* (2013.01); *H01L 21/823828* (2013.01); *H01L 21/823857* (2013.01); *H01L 29/4966* (2013.01); *H01L 29/517* (2013.01); *H01L 29/66545* (2013.01); *H01L 29/78* (2013.01); *H01L 29/665* (2013.01); *H01L 29/6659* (2013.01); *H01L 29/66795* (2013.01)

(58) Field of Classification Search
USPC .................................................. 257/E21.436
See application file for complete search history.

(56) References Cited

U.S. PATENT DOCUMENTS

| | | | |
|---|---|---|---|
| 6,087,249 | A | 7/2000 | Gardner et al. |
| 6,448,192 | B1 | 9/2002 | Kaushik |
| 6,617,212 | B2 | 9/2003 | Cho et al. |

(Continued)

OTHER PUBLICATIONS

Non-Final Office Action from U.S. Appl. No. 11/322,745 mailed Jul. 17, 2008, 15 pgs.

(Continued)

*Primary Examiner* — Stephen W Smoot
(74) *Attorney, Agent, or Firm* — Green, Howard & Mughal, LLP

(57) ABSTRACT

A method of manufacturing a semiconductor device and a novel semiconductor device are disclosed herein. An exemplary method includes sputtering a capping layer in-situ on a gate dielectric layer, before any high temperature processing steps are performed.

10 Claims, 7 Drawing Sheets

(56) References Cited

U.S. PATENT DOCUMENTS

| | | | |
|---|---|---|---|
| 6,621,114 B1 | 9/2003 | Kim et al. | |
| 6,770,516 B2 * | 8/2004 | Wu et al. | 438/154 |
| 7,045,431 B2 | 5/2006 | Rotondaro et al. | |
| 7,915,694 B2 | 3/2011 | Dewey et al. | |
| 8,390,082 B2 * | 3/2013 | Dewey et al. | 257/411 |
| 8,803,255 B2 * | 8/2014 | Dewey et al. | 257/411 |
| 2001/0054387 A1 | 12/2001 | Frankel et al. | |
| 2002/0052124 A1 | 5/2002 | Raaijmakers et al. | |
| 2002/0108927 A1 | 8/2002 | Hsu | |
| 2004/0016973 A1 | 1/2004 | Rotondaro et al. | |
| 2004/0023462 A1 | 2/2004 | Rotondaro et al. | |
| 2004/0043578 A1 | 3/2004 | Marsh | |
| 2004/0214352 A1 | 10/2004 | Kijima et al. | |
| 2004/0217433 A1 * | 11/2004 | Yeo et al. | 257/412 |
| 2005/0260347 A1 | 11/2005 | Narwankar et al. | |
| 2005/0269651 A1 | 12/2005 | Chen et al. | |
| 2006/0131675 A1 | 6/2006 | Wang et al. | |
| 2007/0093012 A1 | 4/2007 | Chua et al. | |
| 2007/0145454 A1 | 6/2007 | Bhattacharyya | |

OTHER PUBLICATIONS

Non-Final Office Action from U.S. Appl. No. 12/354,702 mailed Jun. 1, 2009, 9 pgs.

Final Office Action from U.S. Appl. No. 12/354,702 mailed Nov. 16, 2009, 8 pgs.

Non-Final Office Action from U.S. Appl. No. 12/354,702 mailed Apr. 15, 2010, 9 pgs.

Final Office Action from U.S. Appl. No. 12/354,702 mailed Aug. 3, 2010, 9 pgs.

Non-Final Office Action from U.S. Appl. No. 13/044,356 mailed Mar. 26, 2012, 8 pgs.

Final Office Action from U.S. Appl. No. 13/044,356 mailed Jul. 20, 2012, 10 pgs.

Non-Final Office Action from U.S. Appl. No. 13/770,767 mailed Aug. 20, 2013, 9 pgs.

Final Office Action from U.S. Appl. No. 13/770,767 mailed Dec. 11, 2013, 9 pgs.

* cited by examiner

GATE ELECTRODE HAVING A CAPPING LAYER

CROSS-REFERENCE TO RELATED APPLICATIONS

This application is a continuation of U.S. patent application Ser. No. 13/770,767, filed Feb. 19, 2013, which is a continuation of U.S. patent application Ser. No. 13/044,356, filed Mar. 9, 2011, now U.S. Pat. No. 8,390,082, issued Mar. 5, 2013, which is a continuation of U.S. patent application Ser. No. 12/354,702, filed Jan. 15, 2009, now U.S. Pat. No. 7,915,694, issued Mar. 29, 2011, which is a divisional of U.S. patent application Ser. No. 11/322,745, filed Dec. 30, 2005, now U.S. Pat. No. 7,524,727, issued Apr. 28, 2009, the entire contents of which are hereby incorporated by reference herein.

FIELD OF THE INVENTION

The present invention relates generally to semiconductor structures and manufacturing. In particular, the present invention relates to the manufacturing of high dielectric constant gate stacks.

BACKGROUND OF THE INVENTION

Advances in semiconductor manufacturing technology have led to the integration of billions of circuit elements, such as transistors, on a single integrated circuit (IC). In order to integrate increasing numbers of circuit elements onto an integrated circuit it has been necessary to reduce the dimensions of the electronic devices (i.e., a metal-oxide-semiconductor (MOS) transistor).

This scaling down involves making all of the layers in the electronic devices as thin as possible. Silicon dioxide has been the preferred gate dielectric material; however, additional thinning of silicon dioxide compromises the performance and functionality of the electronic devices (e.g., lost function due to charge leakage). One practice has been to substitute the silicon dioxide layer with a higher permittivity gate dielectric since a high permittivity layer can be made thicker and still maintain a high capacitance characteristic. The materials used to form the high permittivity gate dielectric are referred to as high dielectric constant (high-k) dielectric materials.

Most high-k gate dielectric materials however, are not compatible with crystalline silicon or polycrystalline silicon (polysilicon) gate electrodes. In order to switch to the high-k gate dielectric, many manufacturers have replaced the conventional polysilicon gate electrode with a metal gate electrode.

BRIEF DESCRIPTION OF THE DRAWINGS

The invention is described by way of example with reference to the accompanying drawings, wherein.

DETAILED DESCRIPTION

A method, which includes depositing a dielectric layer on a substrate, followed by deposition of a capping layer in-situ over the dielectric layer prior to any high temperature processing, is disclosed herein. The capping layer acts as an oxygen diffusion barrier or seal to prevent exposure of the dielectric layer to oxygen. An optionally sacrificial barrier layer may be deposited between the dielectric layer and the capping layer. Each of the dielectric layer, barrier layer and capping layer are desirably formed in situ and without exposing the layers to oxygen.

In one embodiment, when the dielectric layer is formed on the substrate, the dielectric layer is a kinetic product. That is, the dielectric layer is formed using a low energy (e.g., low temperature) process. A capping layer is then formed on the kinetic product dielectric layer to seal the dielectric layer until a subsequent high energy process occurs. A high energy (e.g., high temperature) process, such as, for example, annealing, results in a transformation of the dielectric layer from a kinetic product to a thermodynamic product (i.e., more thermodynamically stable). After the transformation, a replacement gate process may be subsequently performed, because the stack can be exposed to oxygen without risking the disadvantageous effects of oxygen exposure. Deposition of a metal gate electrode over the dielectric layer may follow the removal process.

Figure 1:
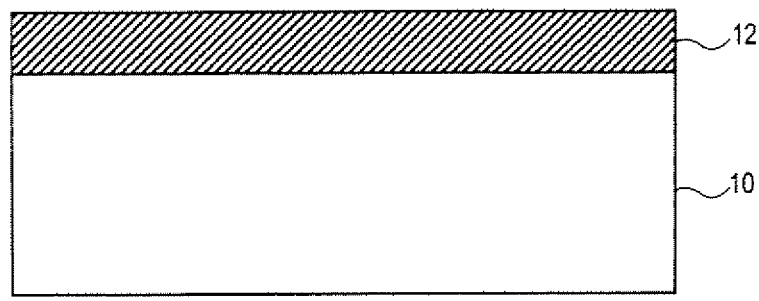
FIG. 1 is an end cross-sectional view illustrating a semiconductor structure after formation of a dielectric layer on a substrate according to an embodiment of the invention.

As shown in FIG. 1 of the accompanying drawings, the process begins by providing a substrate 10. Any well-known substrate, such as, but not limited to, a monocrystalline silicon may be used. In one embodiment, the substrate 10 is a silicon wafer. The substrate 10 may be formed from other materials, such as, but not limited to, germanium, indium antimonide, lead telluride, indium arsenide, indium phosphide, gallium arsenide, gallium antimonide and the like. The substrate 10 may be a silicon-on-insulator structure.

With reference back to FIG. 1, the process continues by depositing a dielectric layer 12 on the substrate 10. In one embodiment, the dielectric layer 12 is a gate dielectric layer.

The dielectric layer 12 is desirably made of a high-k material; that is, the high-k dielectric layer 12 is made of a material having a dielectric constant (k) greater than that of silicon dioxide (e.g., ~4). Some of the materials that may be used to make the high-k gate dielectric layer 12 include, but are not limited to: hafnium oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, lead zinc niobate, and the like.

In one embodiment, the dielectric layer 12 is sufficiently thick to electrically isolate the substrate from a subsequently formed gate electrode. In one embodiment, the thickness of the dielectric layer 12 is about 5-25 angstroms.

The dielectric layer 12 may be formed on substrate 10 using any suitable technique including, but not limited to, atomic layer deposition (ALD), thermal oxidation, chemical vapor deposition (CVD) and physical vapor deposition (PVD) processes. In one embodiment, the dielectric layer is formed by an ALD process. In the ALD process, the dielectric layer 12 is formed by exposing the substrate to alternating metal-containing precursors and oxygen-containing precursors until a layer having the desired thickness has been formed. Exemplary metal precursors include hafnium tetrachloride and lanthanum trichloride. An exemplary oxygen-containing precursor is water. In another embodiment, the dielectric layer 12 is formed by depositing a metal layer on the substrate and then thermally oxidizing the metal layer.

In one embodiment, the process used to form the dielectric layer 12 results in a dielectric layer 12 being formed as a kinetic product. When the dielectric layer 12 is a kinetic product, the dielectric layer material may have vacant sites. If the dielectric layer 12 is exposed to oxygen, oxygen may pass through the vacant sites to form an interfacial silicon oxide layer at the interface of the dielectric layer 12 and the substrate 10, which can lead to an increase in the equivalent oxide thickness (EOT) of the gate dielectric layer. When the dielectric layer 12 is a kinetic product, it is also less stable. However, the processes which result in a kinetic product also allow for greater accuracy and produce a dielectric layer 12 that is thin and uniform.

Figure 2:
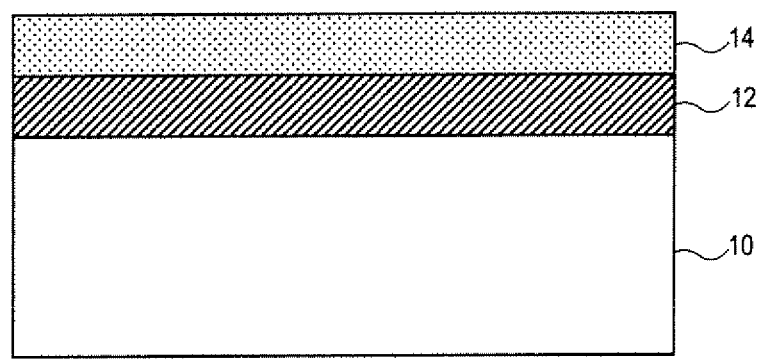
FIG. 2 is an end cross-sectional view further illustrating a semiconductor structure after formation of a barrier layer on the dielectric layer according to an embodiment of the invention.

In some embodiments, the process continues by forming an optional barrier layer 14 on the dielectric layer 12, as shown in FIG. 2. The barrier layer 14 prevents interaction of a subsequently formed capping layer (see FIG. 3) with the dielectric layer 12.

Accordingly, in one embodiment, the barrier layer 14 is sufficiently thick to isolate the dielectric layer 12 from the subsequently formed capping layer (see FIG. 3). The thickness of the barrier layer 14 is typically less than 25 angstroms, and more typically 10-20 angstroms.

In one embodiment, the barrier layer 14 and the dielectric layer 12 are deposited in situ. That is, exposure of the substrate 10 to oxygen between formation of each layer is minimized, such as by forming and/or transferring the layers under vacuum or inert ambient. In particular, the barrier layer 14 is formed by a process in which the dielectric layer 12 is not exposed to oxygen. In one embodiment, the dielectric layer 12 and barrier layer 14 are formed in the same chamber. In addition, the barrier layer 14 is typically deposited at a low temperature.

Any process suitable for depositing thin layers on a semiconductor device, as known to those of skill of the art, may be used to form the barrier layer 14, such as, for example, ALD, CVD, PVD (e.g., sputtering) or mechanical deposition.

The barrier layer 14 may be any suitable material that resists impurity diffusion and forms a chemically stable interface with the dielectric layer 12. The barrier layer 14 may be formed from a metal or a dielectric material. An exemplary metal includes titanium nitride ($Ti_xN_y$). Exemplary dielectric materials include hafnium nitride and silicon nitride ($Si_3N_4$).

In some embodiments of the invention, the barrier layer 14 is sacrificial, in which case the barrier layer 14 is subsequently removed and does not form part of the gate stack. In this case, the barrier layer 14 may be a dielectric layer, such as, for example, hafnium nitride ($Hf_xN_y$), or a metal, such as, for example, titanium nitride ($Ti_xN_y$).

In other embodiments of the invention, the barrier layer 14 is non-sacrificial, in which case the barrier layer 14 remains and forms part of the gate stack. In this case, the barrier layer 14 may be a metal, such as, for example, titanium nitride ($Ti_xN_y$).

In embodiments in which the barrier layer 14 is non-sacrificial and formed from a metal, the barrier layer 14 is formed sufficiently thin so as to be transparent to the work function (WF) controlling metal or metals of the gate electrode. In one embodiment, the barrier layer 14 is formed to a thickness less than 25 angstroms.

In one specific embodiment, the dielectric layer 12 is $HfO_2$ and is formed on the substrate using an ALD process, and the barrier layer 14 is $Ti_xN_y$ and is in situ sputter deposited on the dielectric layer 12.

Figure 3:
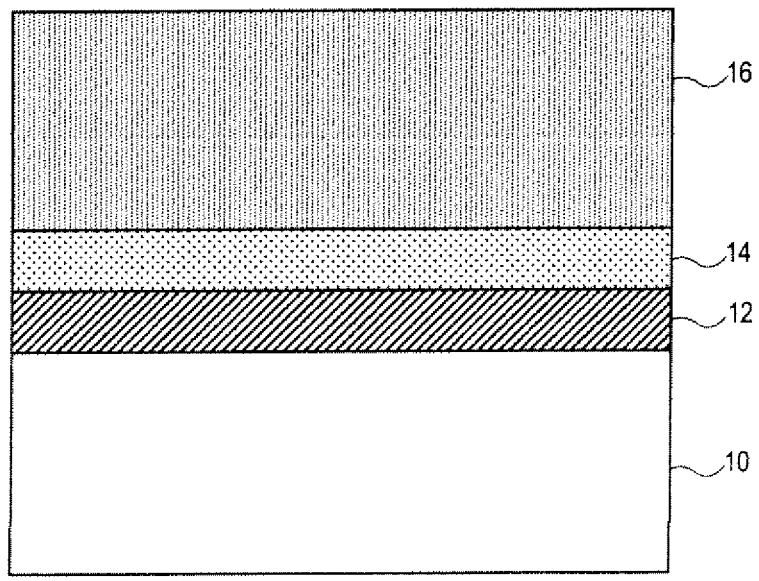
FIG. 3 is an end cross-sectional view further illustrating a semiconductor structure after sputtering a capping layer on the barrier layer according to an embodiment of the invention.

As shown in FIG. 3, the process continues by forming a capping layer 16 on the barrier layer 14. The capping layer 16 is typically a conformal film.

The function of the capping layer 16 is to seal the dielectric layer 12 from oxygen and other impurities, which can flow through the dielectric layer 12 to cause oxide growth on the underlying substrate or otherwise alter the quality of the dielectric layer 12. It may be particularly desirable to seal the dielectric layer 12 when it is a kinetic product. The capping layer 16 prevents nitridization and oxidation of the dielectric layer 12 that may occur during later processing steps. In one embodiment, the capping layer 16 desirably seals the dielectric layer 12 and optional barrier layer 14 until the dielectric layer 12 is converted from a kinetic product into a thermodynamically stable product.

In one embodiment, the capping layer 16 is formed "in situ" with the dielectric layer 12 and, if used, the barrier layer 14. The capping layer 16 is formed on the optional barrier layer 14 and dielectric layer 12 using a process in which the dielectric layer 12 is not exposed to oxygen. Although the process may be performed under vacuum, other processes which minimize oxygen availability may be used. In one embodiment, the capping layer 16 is sputter deposited on the dielectric layer 12.

In one embodiment, the capping layer 16 is sufficiently thick to prevent oxygen from passing through to the barrier layer 14 and dielectric layer 12. In some embodiments, the thickness of the capping layer 16 is at least 200 angstroms.

The capping layer 16 is ideally formed at a low temperature using one of the previously described processes for depositing thin layers, such as, for example, sputtering to prevent incorporation of impurities into the dielectric layer 12. In one embodiment, the formation of the capping layer 16 is at a low temperature. In one embodiment, the capping layer 16 is formed at a temperature that is less than about 350° C.

In one embodiment, the capping layer 16 is formed from a material that can be selectively removed in a subsequent replacement gate process. In one embodiment, the capping layer 16 is a material that increases hardening of the dielectric layer 12. In one embodiment, the capping layer 16 is a material that can withstand subsequent processing steps which occur at temperatures greater than about 1200° C.

In one embodiment, the capping layer 16 is silicon. Other exemplary capping layer materials include germanium, silicon germanium, silicon nitride, and the like.

In a specific embodiment of the present invention, the capping layer 16 is an in situ sputter deposited amorphous silicon film. An amorphous silicon film contains random grain boundaries which prevent channeling of oxygen through the dielectric layer 12.

In one specific embodiment, the dielectric layer 12 is HfO2 and is formed on the substrate using an ALD process, and the optional barrier layer 14 is TixNy and is in situ sputter deposited on the dielectric layer. In one specific embodiment, the capping layer 16 is silicon and is in situ sputter deposited at room temperature.

As discussed above, the layers 12-16 may be formed in situ. In one embodiment, a cluster tool, such as the cluster tool shown in FIG. 3A, may be used to accomplish in situ deposition of layers 12-16. The processes for forming each of the layers 12-16 may be done in the same chamber or a different chamber than each of the other processes.

Figure 3A:
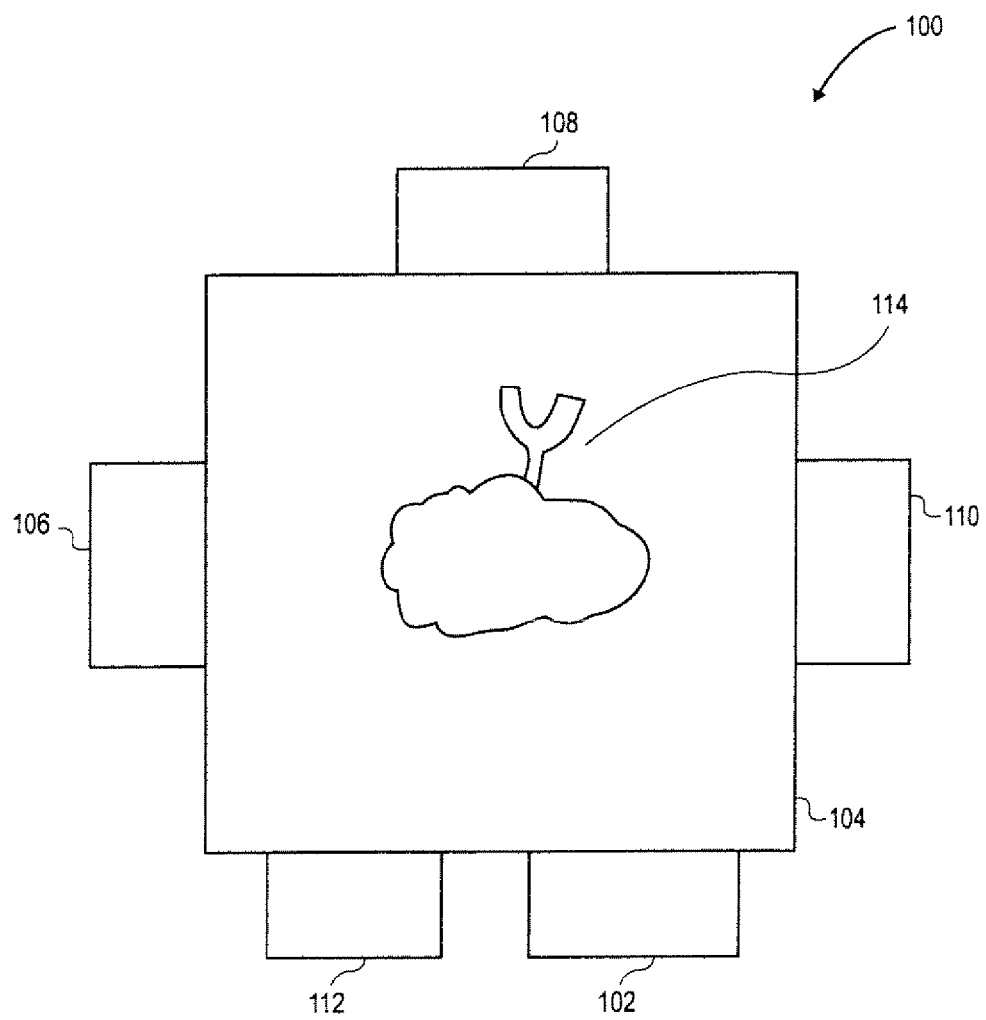
FIG. 3A is a schematic view illustrating a cluster tool for making a semiconductor structure without exposure to oxygen.

FIG. 3A shows a cluster tool 100, which, in one embodiment, may be used to complete the depositions in situ. The cluster tool 100 includes a Front Opening Unified Pod (FOUP) 102, a transfer chamber 104, a dielectric layer deposition chamber 106, a barrier layer deposition chamber 108, a capping layer deposition chamber 110 and a computer 112. The transfer chamber 104 may include a robot 114 therein.

The transfer chamber 104 is desirably vacated or has an inert ambient. The transfer chamber 104 is centrally located, such that each of the FOUP 102 and chambers 106, 108 and 110 are branches off of the transfer chamber 104. The robot 114 allows the wafer to be transferred among each of the chambers 104-110. The dielectric layer deposition chamber 106 may be an ALD chamber. The deposition chamber 108 may be a sputter chamber. The capping layer deposition chamber 110 may also be a sputter chamber.

In use, the computer 112 controls the movement of the semiconductor wafer among each of the chambers 102-110 via robot 114. The computer 112 also controls the submodules (the processes) associated with each of the chambers. As a result, a substrate can be transferred between each of the chambers 106, 108 and 110, respectively, through the transfer chamber 104, without breaking the vacuum (i.e., without exposing the layers to oxygen) to form the stack shown in FIG. 3.

In one embodiment, the process begins by placing a silicon wafer in the FOUP 102. The silicon wafer then passes through the transfer chamber 104, which is under vacuum and/or in an inert ambient. The wafer passes from the transfer chamber 104 and into the dielectric layer deposition chamber 106, where a dielectric layer 12, such as HfO2, is formed on the substrate using an ALD process. The wafer then passes through the transfer chamber 104, and into the barrier layer deposition chamber 108, where a barrier layer 14, such as TixNy, is sputter deposited on the dielectric layer. The wafer then passes through the transfer chamber 104 and into the capping layer deposition chamber 110, where a capping layer 16, such as silicon, is deposited at room temperature under vacuum using a PVD process. The capping layer 16 seals the dielectric layer 12 and optional barrier layer 14, so no interstitial oxide layer is formed at the interface of the substrate and dielectric layer.

Figure 4:
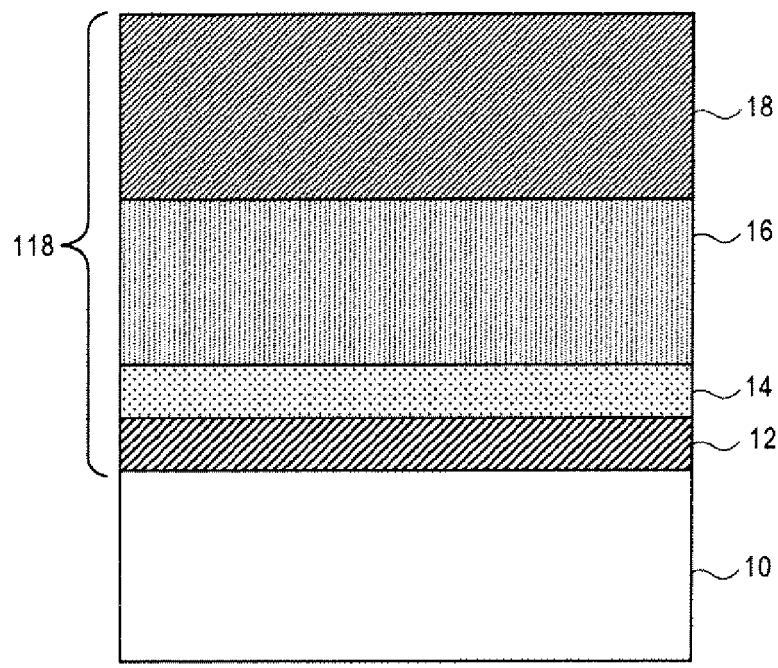
FIG. 4 is an end cross-sectional view illustrating a semiconductor structure after formation a polysilicon layer on the capping layer according to an embodiment of the invention.

The process may continue by depositing a masking layer 18 on the capping layer 16, as shown in FIG. 4. The layers 12-18 together form a stack of films 118.

The masking layer 18 acts as a mask during an ion implantation process which follows deposition of the masking layer 18. In one embodiment, the masking layer 18 is formed from polysilicon.

Figure 5:
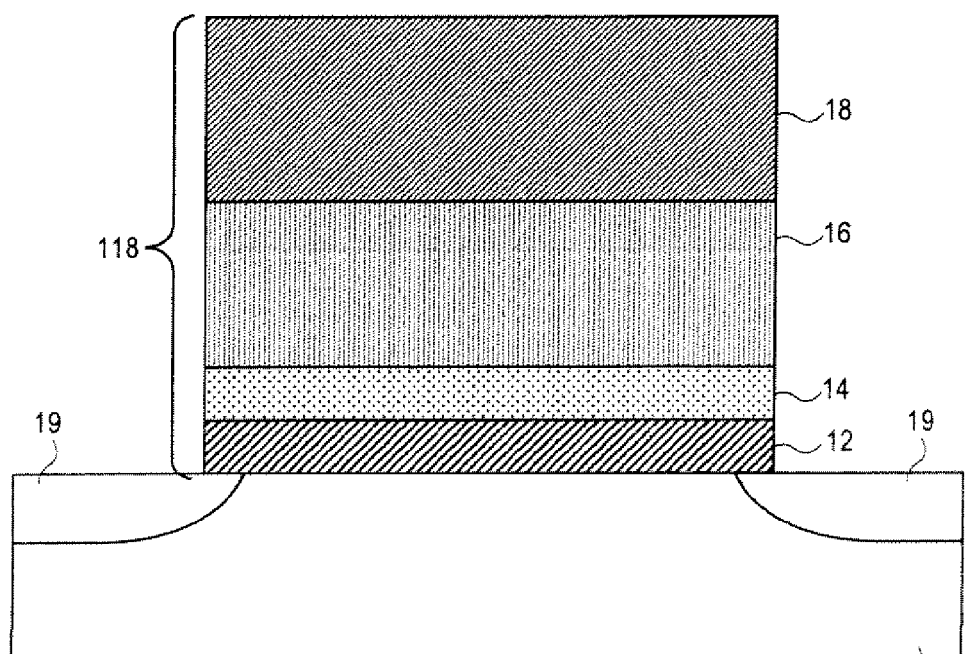
FIG. 5 is an end cross-sectional view illustrating a semiconductor structure after ion implantation of the substrate according to an embodiment of the invention.

In one embodiment, the masking layer 18 is sufficiently thick for ion implantation (See FIG. 5). In one embodiment, the masking layer 18 is sufficiently thick to mask an underlying channel region (see FIG. 5).

The masking layer 18 is deposited using any well known process, such as, for example, CVD. In one embodiment, the masking layer 18 is deposited using a CVD process in a CVD chamber. In one embodiment, the CVD chamber is part of the cluster tool, described above with reference to FIG. 3A.

Alternatively, the masking layer 18 may be deposited outside of the vacuum. It is to be appreciated that because the capping layer 16 has been deposited and acts as an oxygen seal, the masking layer 18 does not need to be deposited in situ.

In one embodiment, the masking layer 18 is a sacrificial gate electrode. That is, the masking layer 18 will be removed in a subsequent replacement gate process (See FIG. 8).

Next, the masking layer 18 is patterned with, for example, well known photolithography and etching steps. In one embodiment, all of the layers (i.e., dielectric layer 12, barrier layer 14, capping layer 16, and masking layer 18) are patterned.

The process continues, as shown in FIG. 5, by implanting the substrate 10 with ions to form source/drain extensions 19. A channel region is thereby formed between the source/drain extensions 19 and under the dielectric layer 12.

Figure 6:
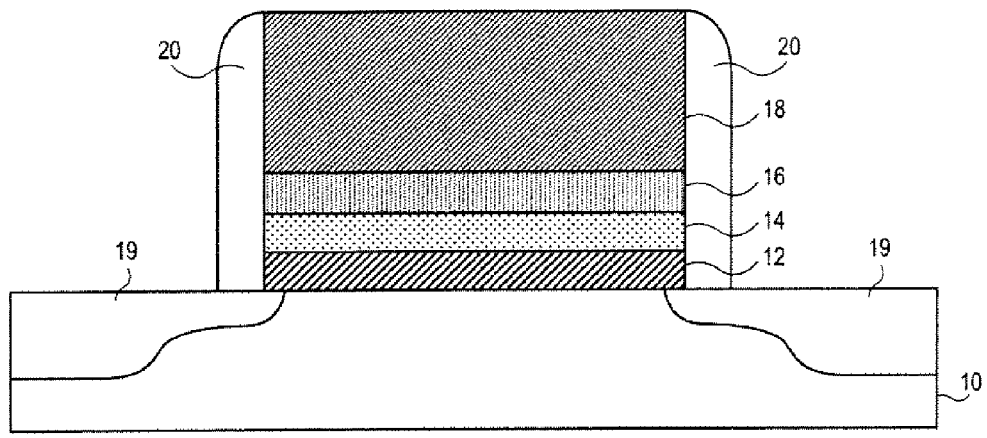
FIG. 6 is an end cross-sectional view illustrating a semiconductor structure after formation of spacers on the substrate according to an embodiment of the invention.

As shown in FIG. 6, the process may continue by depositing spacers 20. Spacers 20 seal the sides of the structure, and encapsulate the dielectric layer 12.

The spacers 20 are typically made of nitride or oxide. Exemplary spacer materials include, but are not limited to, silicon nitride, carbon doped nitride, or carbon doped nitride without oxide components.

In one embodiment, the spacers 20 are formed by a CVD process. The spacer depositions process occurs, in one embodiment, at a relatively high temperature of approximately 500° C. The temperature (greater than 350° C.) is acceptable because the top surface of the dielectric layer 12 is sealed by the capping layer 16 and the dielectric layer 12 is therefore not exposed or only the edge of the layer is exposed.

In one embodiment, a high temperature step follows spacer deposition, which anneals the dielectric layer 12 and activates the implanted dopants. In one embodiment, the high temperature step is a source drain anneal (SDAL). In one embodiment, the high temperature step is a rapid thermal anneal (RTA).

In one embodiment, silicide is formed during the high temperature step. In particular, in one embodiment, self-aligned silicide (SALICIDE) may be formed during the high temperature step. The silicide may be used to form low-resistance contacts.

During high temperature processes, the dielectric layer 12 may transition from its deposited kinetic product state to a thermodynamic product state. The transition from a kinetic product to a thermodynamic product may cause unsaturated sites in the dielectric layer 13 to become saturated. The resulting thermodynamic dielectric layer 13 is typically more stable and consistent than the kinetic dielectric layer 12.

In one embodiment, the dielectric layer 12 remains sealed with the capping layer 16 until the dielectric layer has transformed from the kinetic product state (12) into its thermodynamically stable state (13) while other processing is done.

It is believed that, during the sputtering process, the capping layer material may enter the lattice structure of the dielectric layer material. The high temperature processing step, such as, for example, an anneal, may harden the capping layer material in the lattice structure of the dielectric material. The vacancies in the dielectric layer 12 thus may be filled with capping layer material. Alternatively, these vacancies may at least be sealed by the capping layer 16. In one embodiment, at least the top surface of the dielectric layer 12 is hardened as a result of the filled vacancies. The incorporation of the capping layer material into the dielectric layer lattice structure may prevent further diffusion of oxygen and nitrogen through the dielectric layer 12. Thus, the gate stack has a dielectric layer 12 that is in a more stable, thermodynamic state because the dielectric layer 12 was sealed with the capping layer 16 during the high temperature processing steps.

In one embodiment, the process ends after the high-temperature processing step.

Figure 7:
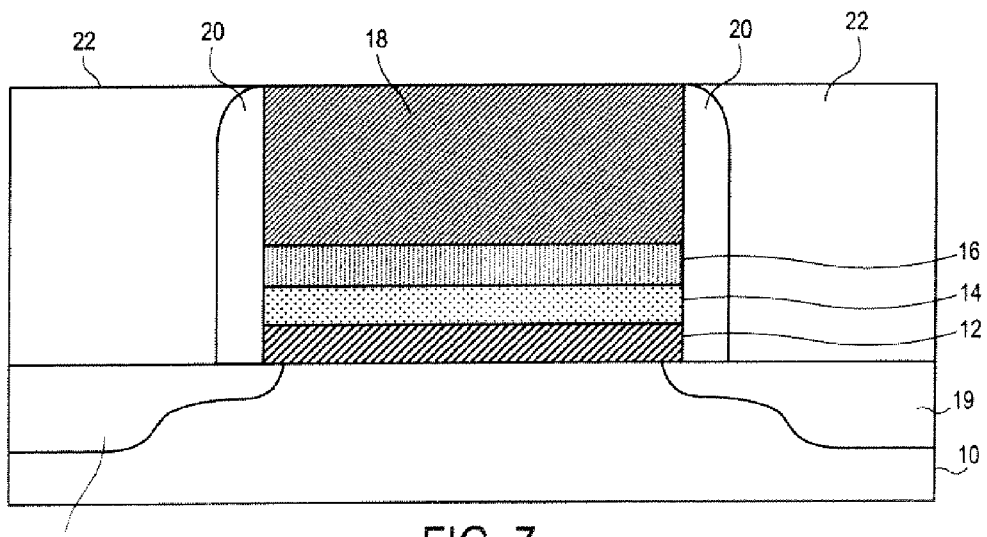
FIG. 7 is an end cross-sectional view illustrating a semiconductor structure after formation of an interlayer dielectric on the substrate according to an embodiment of the invention.

As shown in FIG. 7, in one embodiment, the process continues by forming an interlayer dielectric 22 on the substrate. The interlayer dielectric 22 enables the transistor to be insulated from and connected to other transistor structures.

The interlayer dielectric 22 is deposited using known techniques and using known dielectric materials. The interlayer dielectric 22 may be blanket deposited over the substrate and gate structure, and then planarized using a chemical or mechanical polishing technique, exposing the top surface of the polysilicon layer 18.

In some embodiments, a replacement gate process follows deposition of the interlayer dielectric 22. The stack of films having a thermodynamic dielectric layer 13 is particularly suitable for a replacement gate process because the dielectric layer is thermodynamically stable.

Figure 8:
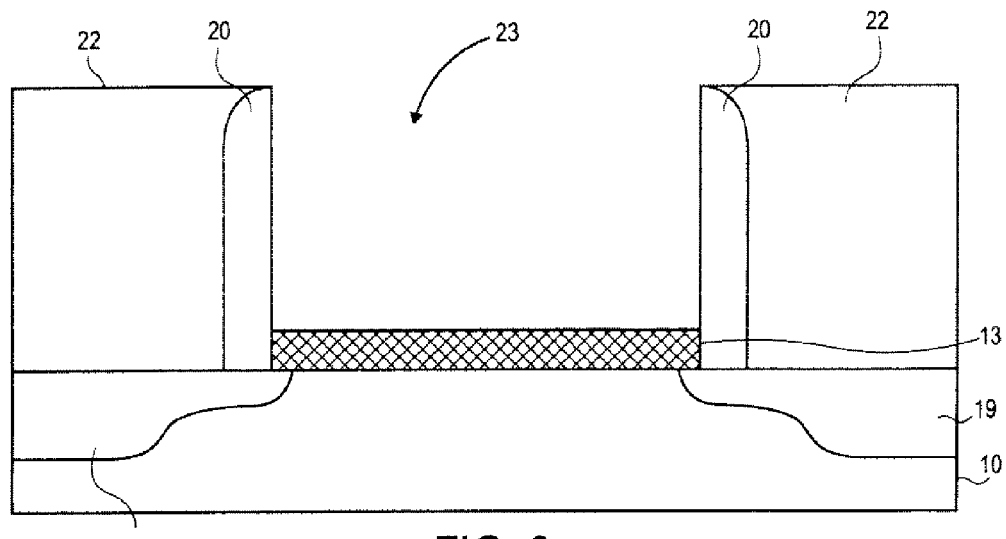
FIG. 8 is an end cross-sectional view illustrating a semiconductor structure after removal of the polysilicon layer, capping layer and barrier layer according to an embodiment of the invention.

As shown in FIG. 8, in one embodiment, a replacement gate process follows deposition of the interlayer dielectric 22. The replacement gate process begins by etching out and removing the polysilicon layer 18 and capping layer 16. Optionally, the barrier layer 14 may also be removed. Thus, a trench 23 is formed between the spacers 20 and above the dielectric layer 13. A wet etch process using, for example, tetramethyl ammonium hydroxide (TMAH), may be used to remove the layers 16, 18. It will be appreciated by those of skill in the art that the material of the capping layer 16 will be different than the material of the spacers 20, as the capping layer 16 is removed, while the spacers 20 remain.

The process leaves, at a minimum, the high-K dielectric layer 13. The dielectric layer 13 that remains is an annealed, electrically thin and intact dielectric layer. The dielectric layer 13 may also be a thermodynamic product.

The capping layer 16 and, optionally, the barrier layer 14 can be removed, and the dielectric layer 13 can be exposed to the atmosphere. The dielectric layer 12 can now be exposed because the dielectric layer 13 has been transformed from a kinetic product into a more stable thermodynamic product state.

Figure 9:
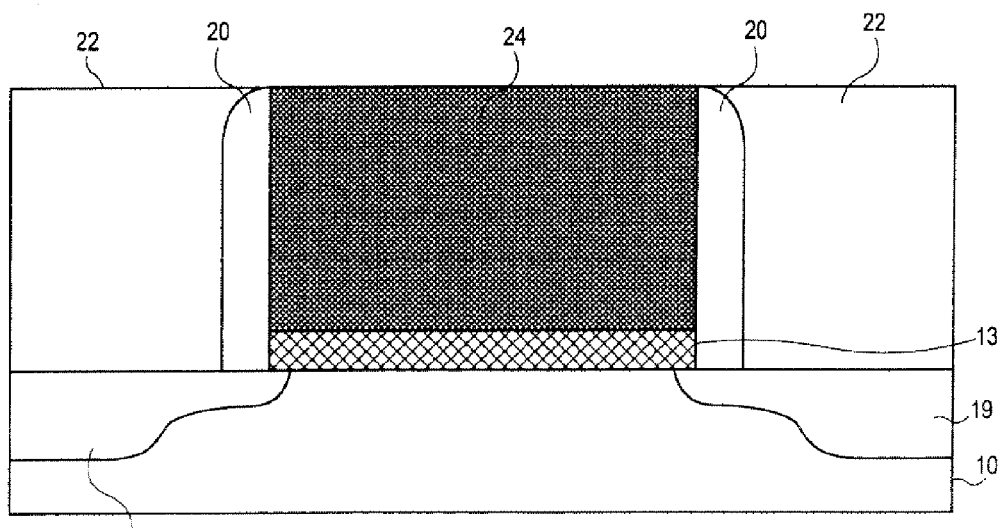
FIG. 9 is an end cross-sectional view illustrating a semiconductor structure after deposition of a metal gate electrode on the dielectric layer according to an embodiment of the invention.

Work function metal deposition may follow removal of the capping layer 16 after the high-temperature steps, as shown in FIG. 9. A transistor having a capping layer and subsequent work function metal deposition typically has thin Tox, correct Vth, and is more reliable.

As shown in FIG. 9, the process may continue by depositing a gate electrode 24 on the annealed dielectric layer 13 and between the spacers 20. In one embodiment, the gate electrode 24 is a metal. A single metal or multiple metals may be used. Exemplary metals include, but are not limited to, aluminum (Al); titanium (Ti); molybdenum (Mo); tungsten (W); metal nitrides and carbides, such as, TixNy, TixCy, TaxNy, TaxCy; and, the like. In an embodiment for a PMOS transistor, a p-type metal having a p-type work function (WF=4.9-5.3 eV) is used. In an embodiment for a NMOS transistor, a n-type metal having a n-type work function (WF=3.9-4.3 eV) is used. In another embodiment, a mid-gap metal (WF=4.3-4.9 eV) may be used.

The gate electrode 24 may be deposited using known techniques. A polishing process, such as chemical mechanical polishing (CMP), may be performed to planarize the surface and expose the gate electrode 24.

Thus, a gate stack having a thermodynamic product dielectric layer 13 is formed. In addition, a gate stack is formed having an ultra-thin transition oxide layer (not shown) or no transition oxide layer. In one embodiment, the ultra-thin transition oxide layer is a monolayer.

Transition layer oxide growth is minimized, or even eliminated, with the in-situ deposition of each of the dielectric layer 12, the barrier layer 14 and the capping layer 16. Transition layer oxide growth is also minimized, or even eliminated, with the deposition of each of the dielectric layer 12, barrier layer 14 and the capping layer 16 at a low temperature. A thinner transition oxide layer results in improved transistor performance and enables gate scaling. In addition, the transformation of the dielectric layer 12 from a kinetic product to a thermodynamic product results in a more reliable gate stack.

Figure 10:
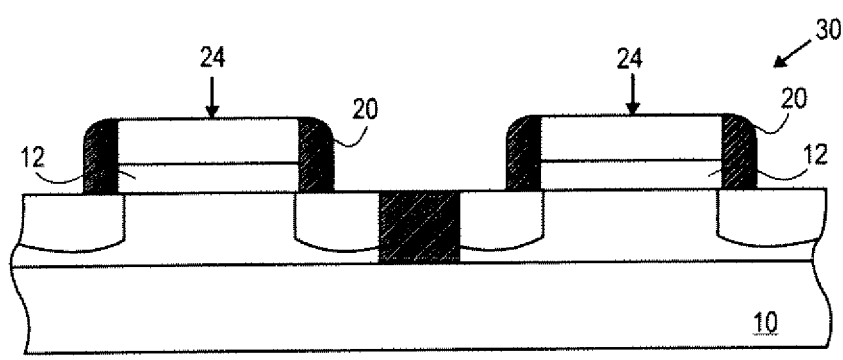
FIG. 10 is an end cross-sectional view of a CMOS transistor.

FIG. 10 is an end cross-sectional view of a conventional complementary metal oxide semiconductor (CMOS) circuit 30, manufactured using the method described in FIGS. 1-9, according to an embodiment of the invention.

The circuit 30 includes a substrate 10, a high-k dielectric layer 12, a gate electrode 24, spacers 20, source region 32 and drain region 34, and a channel region 36.

The dielectric layer 12 is formed on the substrate 10. The gate electrode 24 is formed on the dielectric layer 12. The source and drain regions 32, 34 are formed in the substrate 10 on opposite sides of the gate electrode 24. The spacers 20 are provided on opposite sides of the gate electrode 24 and the dielectric layer 12, and over the source and drain regions 32, 34. The gate electrode 24 may be a p-type, n-type or mid-gap metal.

An ultra-thin transition oxide layer (not shown) may be present between the substrate 10 and dielectric layer 12. The dielectric layer 12 may be a thermodynamic product.

A CMOS circuit includes two transistors 30 (one PMOS transistor and one NMOS transistor), the gates of which are connected to a voltage source. A voltage is applied to the source region 32 of each transistor 30, causing current to flow through the channel region 36 to the drain region 34. A voltage is also applied to the gate electrode 24 of each transistor 30, which interferes with the current flowing in the channel region 36 of each transistor 30. The voltage connected to the gate electrode 24 switches the current on and off in the channel region 36 of each transistor, such that either the PMOS or NMOS is switched on (i.e., current flows through the channel region 36 of only one transistor) at any given time. In NMOS devices, the signal carriers, or electrons, have a negative charge. Current is on when a NMOS transistor gate is at high voltage, and off when its gate is at low voltage. In PMOS devices, the signal carriers are "holes," or an absence of electrons. The current in a PMOS transistor flows opposite that of an NMOS transistor: it is off when its gate voltage is high and on when its gate voltage is low.

Figure 11:
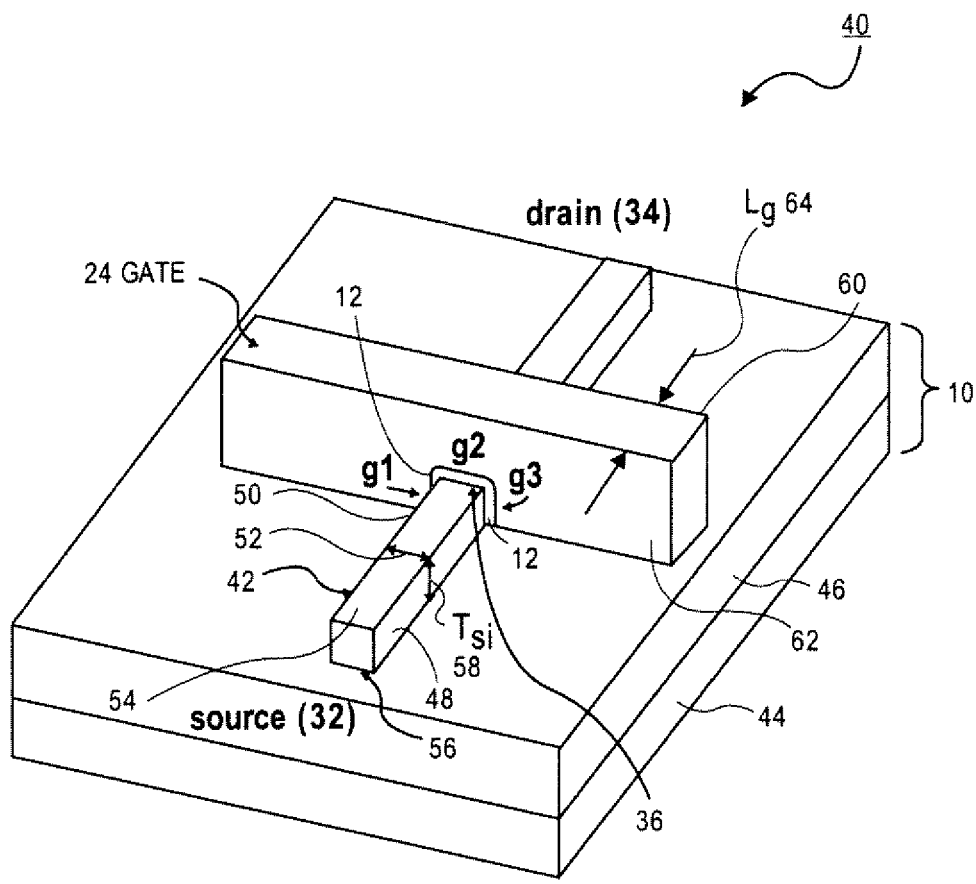
FIG. 11 is a perspective view of a tri-gate transistor.

FIG. 11 is a perspective view of a tri-gate metal oxide semiconductor transistor 40, manufactured using the method described in FIGS. 1-9, according to an embodiment of the invention.

The transistor 40 includes a substrate 10, a semiconductor body 42, a gate dielectric layer 12, a gate electrode 24, a source region 32, a drain region 34 and a channel region 36. The substrate 10 includes a lower monocrystalline substrate 44 and an insulating layer 46. The semiconductor body 42 includes a pair of laterally opposite sidewalls 48 and 50 separated by a distance which defines a semiconductor body width 52, and a top surface 54 and a bottom surface 56 separated by a distance which defines a semiconductor body height 58. The gate electrode 24 has a pair of laterally opposite sidewalls 60 and 62 separated by a distance which defines the gate length 64 of the transistor 40.

The substrate 10 can be an insulating substrate or a semiconductor substrate. The dielectric layer 12 is formed on the top surface 54 and sidewalls 48, 50 of the semiconductor body 42. The gate electrode 24 is formed on the dielectric layer 12 on the top surface 54 of the semiconductor body 42 and is formed adjacent to the gate dielectric layer 12 formed on the sidewalls 48, 50 of the semiconductor body 32. The source and drain regions 32, 34 are formed in the semiconductor body 42 on opposite sides of the gate electrode 24. The gate electrode 24 may be a p-type, n-type or mid-gap metal.

Because the gate electrode 24 and the gate dielectric layer 12 surround the semiconductor body 42 on three sides, the transistor essentially has three separate channels and gates (g1, g2, g3). The gate "width" of a transistor is equal to the sum of each of the three sides of the semiconductor body. Larger "width" transistors can be formed by connecting several tri-gate transistors together.

An ultra-thin transition oxide layer (not shown) may be present between the substrate 10 and dielectric layer 12. The dielectric layer 12 may be a thermodynamic product.

Similar to transistor 30, the gates of transistor 40 are connected to a voltage source. A voltage is applied to the source region 32, causing current to flow through the channel region 36 to the drain region 34. A voltage is also applied to the gate electrode 24, which interferes with the current flowing in the channel region 36. The voltage connected to the gate electrode 24 switches the current on and off in the channel region (g1, g2 and g3).

The methods which are described and illustrated herein are not limited to the exact sequence of acts described, nor are they necessarily limited to the practice of all of the acts set forth. Other sequences of events or acts, or less than all of the events, or simultaneous occurrence of the events, may be utilized in practicing the embodiments of the present invention.

The foregoing description with attached drawings is only illustrative of possible embodiments of the described method and should only be construed as such. Other persons of ordinary skill in the art will realize that many other specific embodiments are possible that fall within the scope and spirit of the present idea. The scope of the invention is indicated by the following claims rather than by the foregoing description. Any and all modifications which come within the meaning and range of equivalency of the following claims are to be considered within their scope.

What is claimed is:

1. A semiconductor transistor, comprising:
    a substrate;
    a transition oxide layer disposed on the substrate;
    a high-k dielectric material layer disposed on the transition oxide layer, the high-k dielectric material layer having a thickness approximately in the range of 5-25 Angstroms;
    a barrier layer disposed on the high-k dielectric material layer;
    a capping layer disposed on the barrier layer and comprising a material different than the barrier layer, wherein the capping layer is formed of one material which includes germanium, silicon germanium, silicon nitride, and amorphous silicon; and
    a gate electrode disposed above the capping layer and comprising a material different than the capping layer, wherein the gate electrode comprises a workfunction controlling metal;
    wherein a thickness of the barrier layer is less than 25 Angstroms.

2. The semiconductor transistor of claim 1, wherein the substrate comprises silicon.

3. The semiconductor transistor of claim 1, wherein the high-k dielectric material comprises hafnium.

4. The semiconductor transistor of claim 1, wherein the barrier layer comprises Ti and N.

5. The semiconductor transistor of claim 1, wherein the gate electrode comprises Ti or Al.

6. A semiconductor transistor, comprising:
    a semiconductor body formed on a substrate, the semiconductor body having a top surface and a pair of laterally opposite sidewalls;
    a transition oxide layer disposed on the top surface and the sidewalls of the semiconductor body;
    a high-k dielectric material layer disposed on the transition oxide layer, the high-k dielectric material layer having a thickness approximately in the range of 5-25 Angstroms;
    a barrier layer disposed on the high-k dielectric material layer;
    a capping layer disposed on the barrier layer and comprising a material different than the barrier layer, wherein the capping layer is formed of one material which includes germanium, silicon germanium, silicon nitride, and amorphous silicon; and
    a gate electrode disposed above the capping layer and comprising a material different than the capping layer, wherein the gate electrode comprises a workfunction controlling metal;
    wherein a thickness of the barrier layer is less than 25 Angstroms.

7. The semiconductor transistor of claim 6, wherein the substrate comprises silicon.

8. The semiconductor transistor of claim 6, wherein the high-k dielectric material comprises hafnium.

9. The semiconductor transistor of claim 6, wherein the barrier layer comprises Ti and N.

10. The semiconductor transistor of claim 6, wherein the gate electrode comprises Ti or Al.

* * * * *